(12) United States Patent
Holland et al.

(10) Patent No.: US 11,271,163 B2
(45) Date of Patent: Mar. 8, 2022

(54) METHOD OF FORMING SEMICONDUCTOR DEVICE HAVING CARBON NANOTUBE

(71) Applicant: TAIWAN SEMICONDUCTOR MANUFACTURING CO., LTD., Hsinchu (TW)

(72) Inventors: Martin Christopher Holland, Bertem (BE); Timothy Vasen, Tervuren (BE); Blandine Duriez, Brussels (BE)

(73) Assignee: TAIWAN SEMICONDUCTOR MANUFACTURING CO., LTD., Hsinchu (TW)

(\*) Notice: Subject to any disclaimer, the term of this patent is extended or adjusted under 35 U.S.C. 154(b) by 8 days.

(21) Appl. No.: 16/387,640

(22) Filed: Apr. 18, 2019

(65) Prior Publication Data

US 2020/0335701 A1 Oct. 22, 2020

(51) Int. Cl.
| | |
|---|---|
| *H01L 51/00* | (2006.01) |
| *H01L 51/05* | (2006.01) |
| *C23C 16/26* | (2006.01) |
| *C30B 29/02* | (2006.01) |
| *C30B 25/02* | (2006.01) |
| *H01L 51/10* | (2006.01) |

(52) U.S. Cl.
CPC .......... *H01L 51/0048* (2013.01); *C23C 16/26* (2013.01); *C30B 25/02* (2013.01); *C30B 29/02* (2013.01); *H01L 51/055* (2013.01); *H01L 51/0002* (2013.01); *H01L 51/0558* (2013.01); *H01L 51/105* (2013.01)

(58) Field of Classification Search
CPC .......... H01L 2924/00; H01L 29/78696; H01L 31/035281; H01L 29/0665; H01L 29/0673
See application file for complete search history.

(56) References Cited

U.S. PATENT DOCUMENTS

2018/0337338 A1\* 11/2018 Wang .............. H01L 31/035209

OTHER PUBLICATIONS

J. Wang et al., "Growing highly pure semiconducting carbon nanotubes by electrotwisting the helicity", Nature Catalysis, Apr. 23, 2018, pp. 326-331, vol. 1.
R. Rao et al., "Single-walled carbon nanotube growth from liquid gallium and indium", Carbon 48 (2010) pp. 3971-3973.
Leon van Kouwen, et al., "Focused Electron-Beam-Induced Deposition of 3 nm Dots in a Scanning Electron Microscope", Nano Letters (2009) vol. 9, No. 5, pp. 2149-2152.
T. Chikyow et al., "Direct Ga deposition by low-energy focused ion-beam system", Surface Science 386 (1997), pp. 254-258.
(Continued)

*Primary Examiner* — Tony Tran
(74) *Attorney, Agent, or Firm* — McClure, Qualey & Rodack, LLP

(57) ABSTRACT

In a method, a charged metal dot is deposited on a first position of a surface of a semiconductor substrate. Then, a charged region is formed on a second position of the surface of the semiconductor substrate, thereby establishing of which an electric field direction from the first position toward the second position. The first position is spaced apart from the second position by a distance. Thereafter, a precursor gas flows along the electric field direction on the semiconductor substrate, thereby forming a carbon nanotube (CNT) on the semiconductor substrate.

19 Claims, 18 Drawing Sheets

(56) References Cited

OTHER PUBLICATIONS

D. Yuan et al., "Horizontally Aligned Single-Walled Carbon Nanotube on Quartz from a Large Variety of Metal Catalysts", Nano Lett., (2008) vol. 8, No. 8 pp. 2576-2579.
Patricia Peinado et al., "Focused Electron and Ion Beam Induced Deposition on Flexible and Transparent Polycarbonate Substrates", American Chemical Society, vol. 9, No. 6 pp. 6139-6146 (2015).

* cited by examiner

METHOD OF FORMING SEMICONDUCTOR DEVICE HAVING CARBON NANOTUBE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, a horizontal gate-all-around (HGAA) transistor has been introduced in an effort to improve gate control by increasing gate-channel coupling, reduce OFF-state current, and reduce short-channel effects (SCEs). A gate structure of the HGAA extends around its horizontal channel region providing access to the channel region on all sides. The HGAA transistors are compatible with conventional complementary metal-oxide-semiconductor (CMOS) processes, allowing them to be aggressively scaled down while maintaining gate control and mitigating SCEs. Furthermore, a suitable material having adequate electrical properties is required for forming the channel region of the HGAA, in pursuit of better performance of the HGAA.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
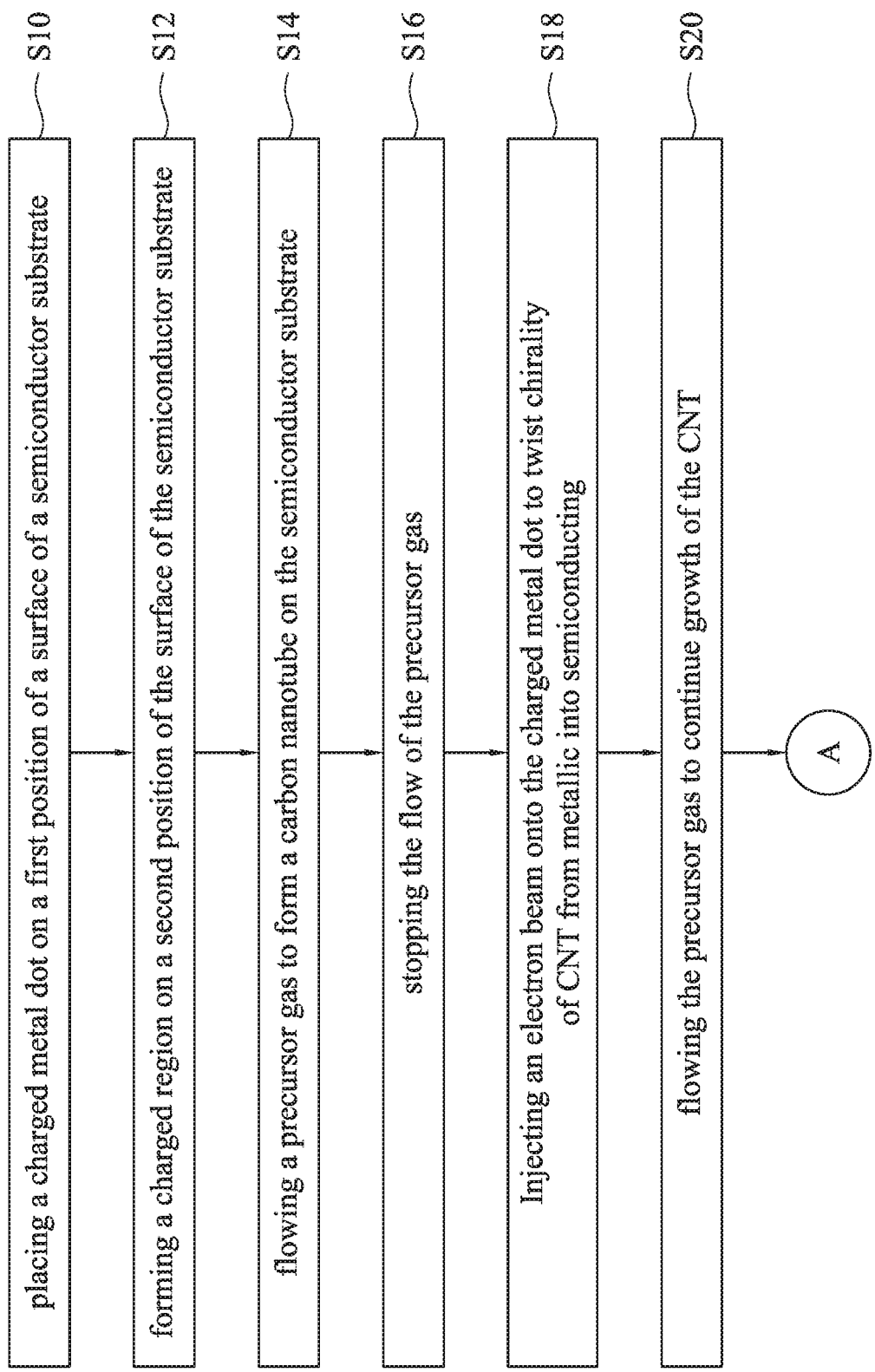
FIG. 1A and FIG. 1B illustrate a flowchart showing a method of forming a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Carbon nanotubes (CNTs) are widely applied on an electronical device because of their excellent electrical properties both as metals and semiconductors. For example, the CNTs can act as one-dimensional ballistic conductors at room temperature as well as field-effect transistors (FETs) with performance comparable to that of silicon FETs. In addition, the CNTS have sufficient mechanical strength and high thermal conductivity. Singlewall CNTs are used in a semiconductor manufacturing process, and a dimension of a catalyst seed (or particle) used to grow the CNTs generally determines whether the singlewall CNTs are semiconducting or metallic. Typically, the single wall CNTs may be formed by depositing an iron (Fe) catalyst strip (or film) on a substrate, annealing the Fe catalyst strip, and introducing a precursor gas containing a material for forming the CNTs over the Fe catalyst strip and applying an external electric field to the Fe catalyst strip, thereby enabling the CNTs to grow along an electrical field direction. However, a mixture of semiconducting and metallic CNTs is formed because of non-uniform diameters of the Fe catalyst strips. To be used as a channel region of a semiconductor device, the semiconducting CNTs are desirable but not the metallic CNTs. However, the typical method fails to properly control the chirality of the CNTs. Furthermore, the magnitude of the electrical field is limited by the distance between the external electrodes, leading to insufficient magnitude of the electrical field, and thus the yield of the CNTs is not satisfactory. Therefore, a method of forming CNTs is required, so as to tackle the above problems.

Embodiments of the present disclosure are directed to providing a method of forming CNTs and a method of forming a semiconductor device having one or more CNTs used as its channel region. In some embodiments, one or more charged metal dots used as catalyst particles are placed on a semiconductor substrate using an ion beam, such that dimensions of the charged metal dots are uniform and CNTs having high purity of the semiconducting CNTs are formed. In other embodiments, a charged region bearing opposite charges to the charged metal dot is formed on the semiconductor substrate and spaced apart from the charged metal dot. A localized electric field is then established between the charged metal dot and the charged region on the semiconductor substrate, and guides the charged metal dot to form a carbon nanotube along a predetermined direction (or an electric field direction). The localized electrical field effectively enhances the magnitude of the electrical field and improves a yield of forming the CNTs. In another embodiment, negatively charging the charged metal dot twists chirality of the CNTs from metallic into semiconducting. The charging operation is performed by applying electrons to the charged metal dot, and high purity of the semiconducting CNT can be realized. The method for forming the CNTs is compatible with typical processes for forming the semiconductor device such as complementary metal-oxide semiconductor (CMOS) device or a memory device.

The term of "the purity of the semiconducting CNT" may represent a percentage of a number of the semiconducting CNT based on a total number of the semiconducting and metallic CNTs is 100%. The higher percentage of the number of the semiconducting CNT is regarded as the higher purity of the semiconducting CNT.

The term of "localized electric field" may represent an electric field formed by charges directly placed on the semiconductor substrate and without external electrodes disposed on two opposing sides of the semiconductor substrate.

Figure 1B:
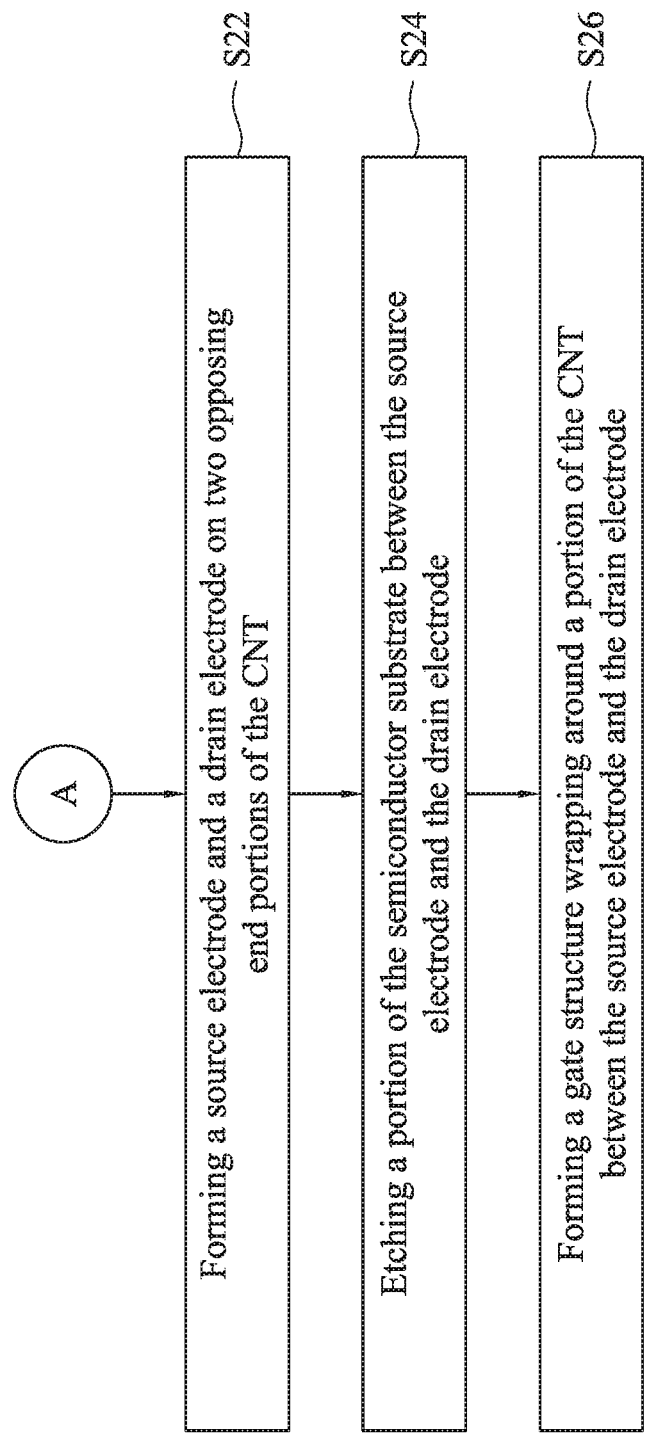
Figure 2A:
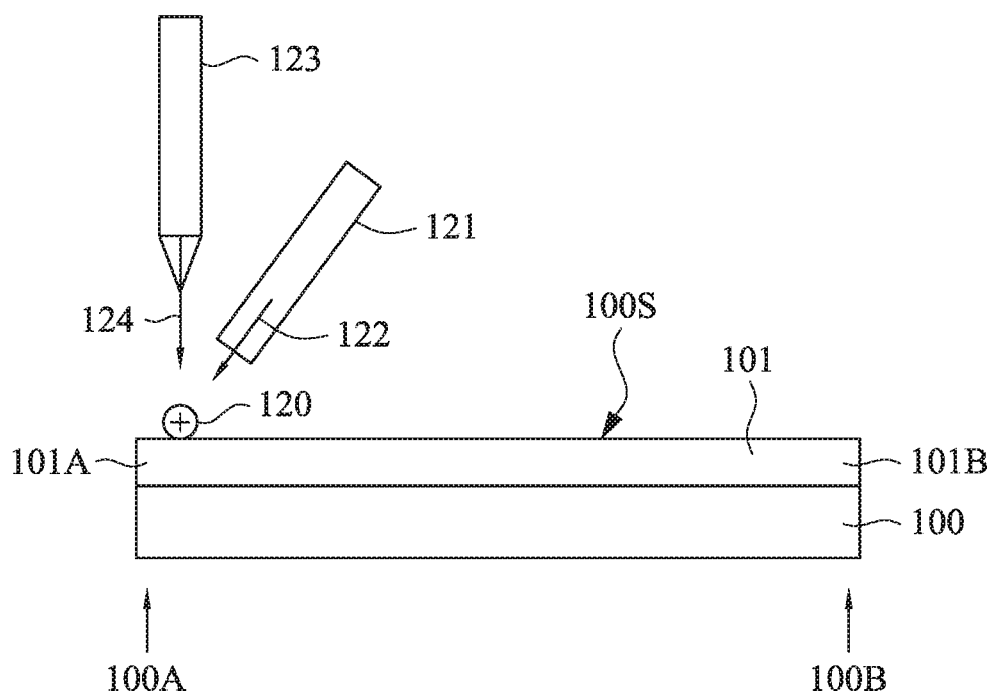
FIG. 2A through FIG. 10B are schematic views showing various intermediate stages of a method of forming a semiconductor device in accordance with some embodiments of the present disclosure.
Figure 2B:
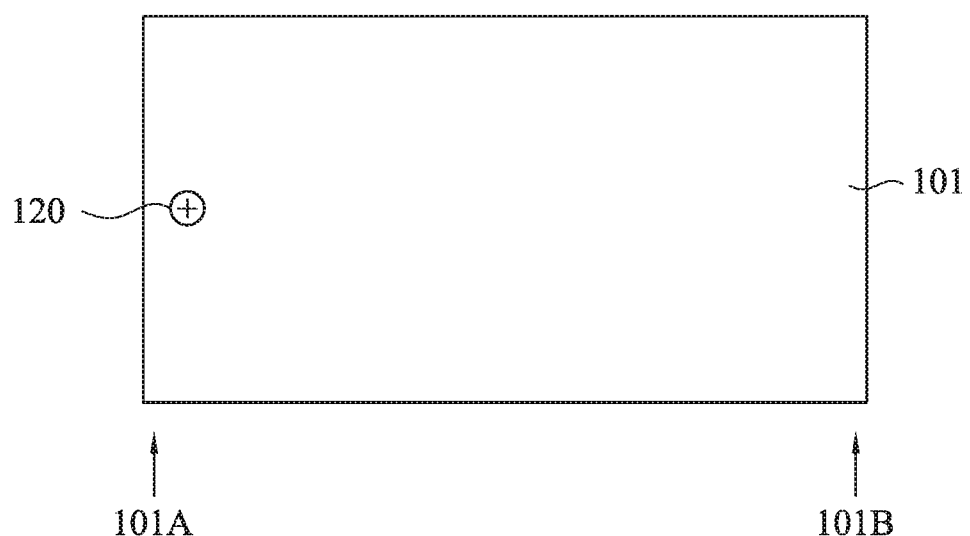

FIG. 1A and FIG. 1B illustrate a flowchart showing a method of forming a semiconductor device in accordance with some embodiments of the present disclosure. FIG. 2A through FIG. 10B are schematic views showing various intermediate stages of a method of forming a semiconductor device in accordance with some embodiments of the present disclosure. Reference is made to FIG. 1A, FIG. 2A and FIG. 2B, in which FIG. 2A is a schematic cross-sectional view and FIG. 2B is a schematic top view of an intermediate stage of forming the semiconductor device. A semiconductor substrate 100 is provided, and the semiconductor substrate 100 may further include an insulating layer 101 deposited thereon in some embodiments. The semiconductor substrate 100 will often be a silicon wafer, for example. However, the semiconductor substrate 100 may be another type of layer, including but not limited to: an elemental semiconductor, such as germanium; an alloy semiconductor, such as silicon-germanium; or a compound semiconductor, such as gallium arsenide or indium phosphide, for example. The insulating layer 101 in some embodiments may be referred to as a "buried oxide" layer. However, the insulating layer 101 may be composed of a material or a combination of materials from a large variety of materials, including but not limited to silicon dioxide, silicon nitride, aluminum oxide, plastic, or polymer, for example. In certain embodiments, the insulating layer 101 is composed of silicon dioxide ($SiO_2$).

At operation S10, a charged metal dot is placed on a first position of a surface of a semiconductor substrate. In some embodiments of the operation S10, a charged metal dot 120 is deposited on one end portion 101A of the insulating layer 101 on a surface 100S of the semiconductor substrate 100 by, for example, focused electron beam induced deposition (FEBID) or focused ion beam induced deposition (FIBID). In other embodiments, the charged metal dot 120 may be placed on the semiconductor substrate 100 by a sputtering operation or any other suitable operations. The end portion 101A is located on a first position 100A of the surface 100S of the semiconductor substrate 100. The charged metal dot 120 on the semiconductor substrate 100 is used as a catalyst particle in the CNT growth process, and it bears positive charges. In some embodiments, a metal of the charged metal dot 120 may be, but is not limited to, gallium (Ga), iron (Fe), cobalt (Co), nickel (Ni), gold (Au), platinum (Pt), palladium (Pd), copper (Cu), manganese (Mn), molybdenum (Mo), chromium (Cr), tin (Sn) or a combination thereof. Generally, deposition of the charged metal dot 120 is performed by flowing a precursor gas 122 and injecting an electron beam 124 onto the semiconductor substrate 100, in which the precursor gas 122 contains the metal ion for forming the charged metal dot 120. The precursor gas 122 may be provided by an ion source 121, and the electron beam 124 may be provided by an electron beam source 123. The ion source 121 is disposed beside the electron beam source 123 and leans away from the electron beam source 123, although other configuration of the ion source 121 and the electron beam source 123 may also be applied.

For example, the precursor gas 122 may include a complex of the metal ion, such as trimethylgallium (TMGa, $Ga(CH_3)_3$), triethylgallium (TEGa, $Ga(C_2H_5)_3$), $(CH_3)_3Pt$ $(CpCH_3)$, $W(CO)_6$ or $Co_2(CO)_9$. In some embodiments, the deposition of the charged metal dot 120 may be performed under an electron beam voltage from about 5 kV to about 30 kV. In other embodiments, the deposition of the charged metal dot 120 may be performed under an electron beam current from about 7.7 pA to a few nanoamperes (nA, e.g., about 1.6 nA). In certain embodiments, the electron beam current is progressively diminished; however, the electron beam current may be a fixed value in other embodiments. In some embodiments, a flowrate of the precursor gas 122 is in a range from about 5 sccm to 200 sccm. In other embodiments, the flowrate of the precursor gas is in a range from about 10 sccm to about 100 sccm. The electron/ion beam voltage, the electron/ion beam current and the flowrate of the precursor gas 122 are defined, such that the charged metal dot 120 can bear positive charges. Furthermore, when the deposition of the charged metal dot 120 is performed under such conditions, the deposited dots 120 may have a uniform, small dimension, such that chirality of the semiconducting CNT can be suitably controlled.

In some embodiments, the dimension of the charged metal dot 120 is not greater than about 3 nm. In certain embodiments, the dimension of the charged metal dot 120 is in a range from about 1 nm to about 3 nm. The charged metal dot 120 having the dimension smaller than about 1 nm is also applicable. However, when the dimension of the charged metal dot 120 is greater than about 3 nm, the charged metal dot 120 might form a multiwall CNT rather than the single-wall CNT. The multiwall CNT may be composed of different types of singlewall CNT that is semiconducting or metallic, and it would be difficult to control the characteristic of the multiwall CNT. The charged metal dot 120 having the dimension greater than 3 nm might also result in the formation of the metallic CNT rather than the semiconducting CNT. In some embodiments, the dimension of the charged metal dot 120 greater than about 3 nm can be reduced to a desired dimension by additional operations, such as an etching operation or thermal evaporation.

Figure 3A:
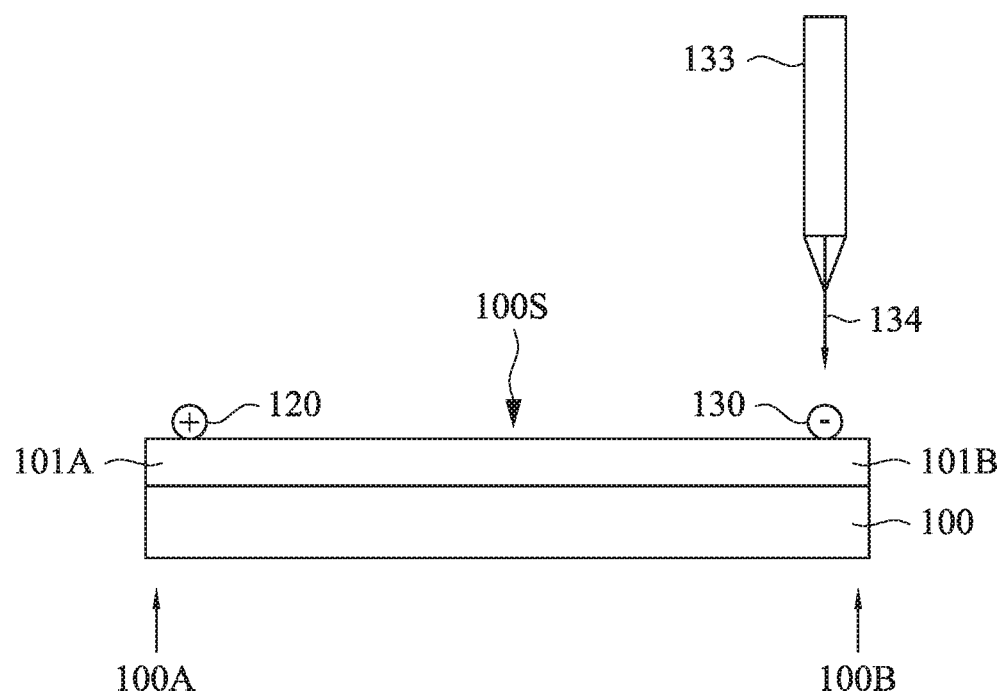
Figure 3B:
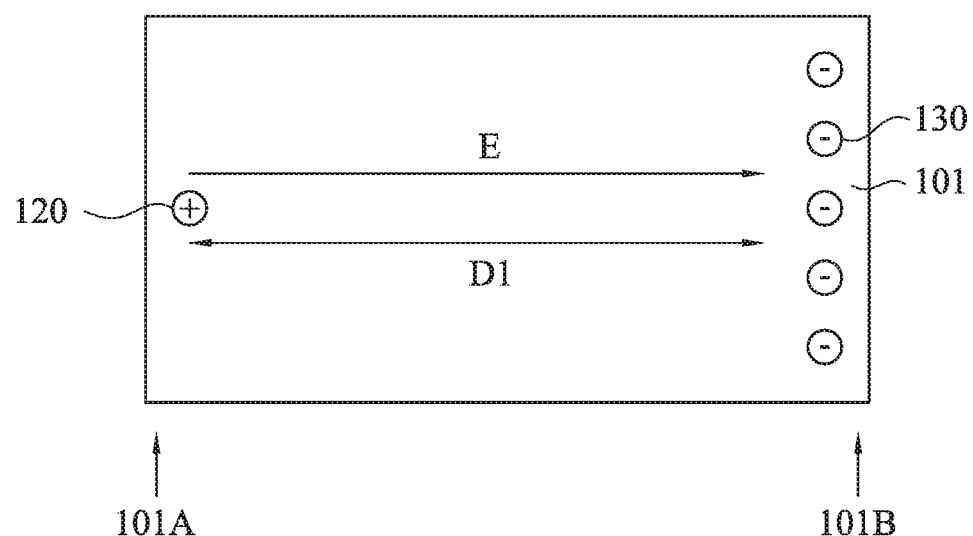

Reference is made to FIG. 1A, FIG. 3A and FIG. 3B. FIG. 3A is a schematic cross-sectional view and FIG. 3B is a schematic top view showing an intermediate stage of forming the semiconductor device. At operation S12, a charged region is formed on a second position of the surface of the semiconductor substrate. In some embodiments of the operation S12, a charged region 130 is formed on an end portion 101B of the insulating layer 101 on the semiconductor substrate 100 by, for example, an electron beam technique. The end portion 101B is located at a second position 100B on the surface 100S of the semiconductor substrate 100. The first position 100A is spaced apart from the second position 100B by a distance. It is noted that the embodiments show the charged metal dot 120 and the charged region 130 are respectively located at the two end portions 101A and 101B of the insulating layer 101, though the charged metal dot 120 and the charged region 130 may be respectively located at other positions on the surface 100S, as long as the charged metal dot 120 and the charged region 130 are spaced apart from each other to provide a distance for the growth of the CNT (described later). In some embodiments, a distance D1 between the charged metal dot 120 and the charged region 130 may be in a range from about 5 nm to about 100 nm. The distance D1 is defined for a suitable strength of an electric field used to form the CNT.

The charged region 130 bears opposite charges to the charged metal dot 120. For example, the electron beam is injected onto the semiconductor substrate 100 to negatively charge a region where the charged region 130 is subsequently formed. The positive charges of charged metal dot 120 and the negative charges of the charged region 130 establish a localized electric field having an electric field direction E between the first position 100A and the second position 100B. In the subsequent process, the CNT may grow along the electric field direction E. In some embodiments, an electron beam 134 is provided from an electron beam source 133 disposed over the semiconductor substrate 100. The electron beam source 133 may be the same one as the electron beam source 123 of FIG. 2A, and the charged region 130 is formed by moving the semiconductor substrate 100 or the electron beam source 133 to a suitable location. However, the electron beam source 133 may be different from the electron beam source 123 of FIG. 2A in other embodiments.

In some embodiments, forming the charged region 130 is performed under an electron beam voltage from about kV to about 30 kV. In some embodiments, forming the charged region 130 is performed under an electron beam current from about 1 pA to about 5 nA. In some embodiments, an operation of forming the charged region 130 is performed to charge a region of tens nm×tens nm for no more than 1 ms. The parameters of the electron beam 134 are defined for applying proper electron beam energy to form the charged region 130. The electron beam with too high energy (e.g., the voltage is greater than 30 kV, the current is greater than 5 nA or the time is longer than 1 ms) may damage the surface of the insulating layer 101 or the semiconductor substrate 100. On the other hand, the electron beam with too low energy may lead to a broader, less adequately-defined e-beam, thereby resulting poor focus of the beam. In certain embodiments, small areas are charged to form the charged region 130, and a relatively low beam current is usually applied.

Figure 3C:
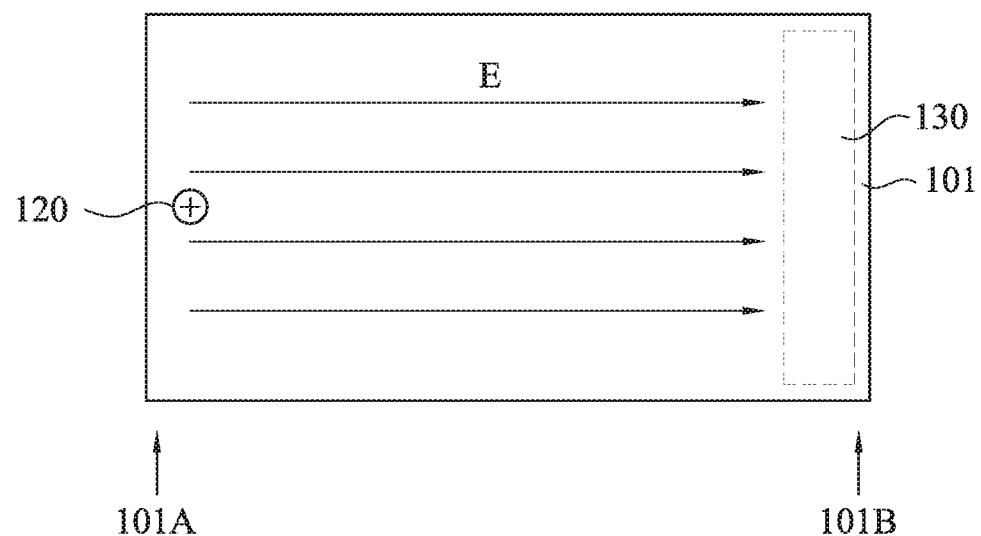

Reference is made to FIG. 3C. FIG. 3C is a top view showing an intermediate stage of forming the semiconductor device. In some embodiment, the localized electric field can be enhanced by enlarging the charged region 130, such that the CNT can grow straight. Furthermore, a higher electric field can also result in a greater ratio of an amount of the semiconducting CNT to an amount of the metallic CNT. In other words, the semiconducting CNT may be dominantly formed under the higher electric field. Generally, the charged region 130 may remain for several days. In some embodiments, the localized electric field formed between the charged metal dot 120 and the charged region 130 on the semiconductor substrate 100 is stronger than the typical external electric field. In other embodiments, strength of the localized electric field is stronger than about 200V/cm within the distance D1 equal to or smaller than about 1 μm.

Figure 4A:
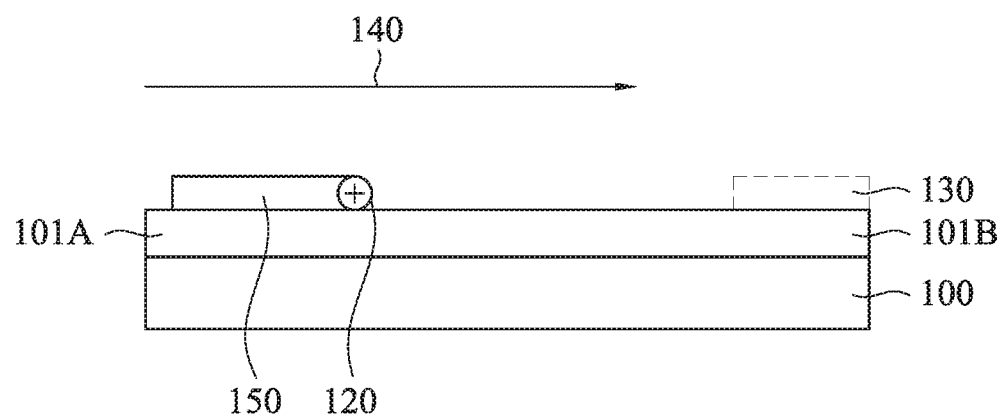
Figure 4B:
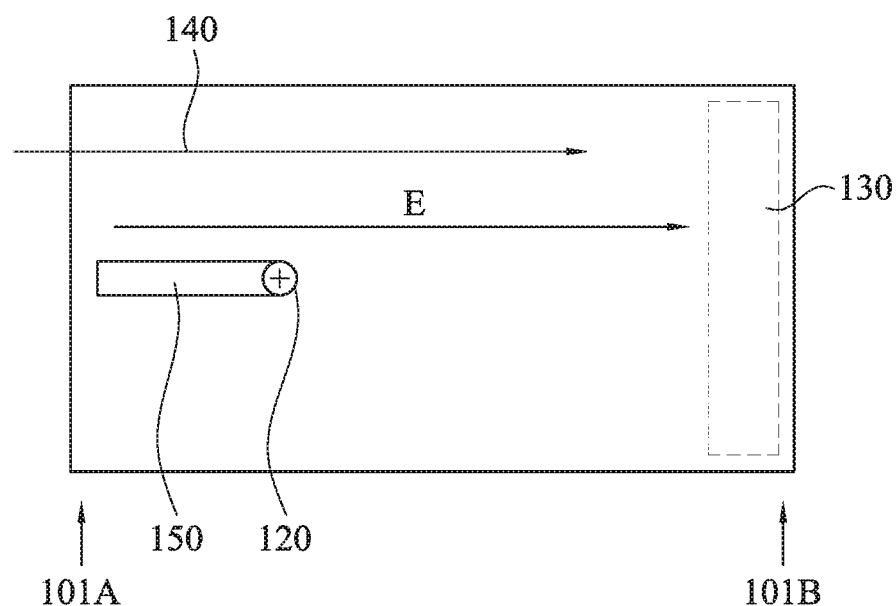

Reference is made to FIG. 1A, FIG. 4A and FIG. 4B. FIG. 4A is a cross-sectional view and FIG. 4B is a top view showing an intermediate stage of forming the semiconductor device. At operation S14, a precursor gas flows to form a carbon nanotube on the semiconductor substrate. In some embodiments of the operation S14, a precursor gas 140 flows along the electric field direction E on the semiconductor substrate 100, so as to epitaxially grow a carbon nanotube 150 on the insulating layer 101 over the semiconductor substrate 100. In some embodiments, the precursor gas 140 may be a hydrocarbon gas ($C_xH_y$), in which x and y are respectively greater than 0. The hydrocarbon gas may include, but is not limited to, methane, ethylene, acetylene, benzene, xylene, cyclohexane, fullerene, naphthalene and the like. During the CNT growth process, a thermal decomposition of the precursor gas 140 occurs in the presence of the charged metal dot 120 as the catalyst particle. A carrier gas also flows with the flow of the precursor gas 140 along the electric field direction E, in which the carrier gas may include hydrogen gas, nitrogen gas or argon gas. In the embodiments of FIG. 4A and FIG. 4B, the CNT 150 grows via tip growth (i.e., the charged metal dot 120 is at a tip of the CNT 150). During the tip growth of the CNT 150, the charged metal dot 120 moves toward the charged region 130, although some residual metal may remain in a base of the CNT 150 where the epitaxy starts, in which the residual metal is detectable. For example, the residual metal may have a concentration of about $10^{17}$ cm$^{-3}$ or more. In other embodiments, the CNT may grow via base growth.

In some embodiments, the CNT 150 is formed by a metal-organic chemical vapor deposition (MOCVD), in which the hydrogen gas is applied when the precursor gas 140 flows, so as to reduce impurities formed on the CNT 150. In such embodiments, the CNT 150 epitaxially grows under a temperature from about 900° C. to about 950° C. In such embodiments, a flowrate of the precursor gas 140 may be in a range from about 0.5 sccm to about 10 sccm. When the flowrate of the precursor gas 140 is greater than 10 sccm, a distorted CNT might be formed because there are too many carbon atoms in the charged metal dot 120; however, when the flowrate of the precursor gas 140 is smaller than 0.5 sccm, the epitaxial growth of the CNT 150 might not start or might start at different times in different locations. In such embodiments, a flowrate of the hydrogen gas may be in a range from about 5 slm to about 50 slm. In a further embodiment, a ratio of the flowrate of the hydrogen gas to the flowrate of the precursor gas is in a range about 500 to about 1000 for the adequate growth rate of the CNT 150. In some embodiments, a diameter for the semiconducting CNT 150 is expected to be substantially the same as the dimension of the charged metal dot 120, and the CNT 150 having the diameter within this range will be semiconducting. The diameter of the CNT 150 is mainly determined by the dimension of the charged metal dot 120, and thus adequately controlling the dimension of the charged metal dot 120 is advantageous to the purity of the semiconducting CNT.

Ideally, the CNT 150 formed by the catalyst of the charged metal dot 120 is singlewall semiconducting CNT. However, it is likely that the CNT 150 might be metallic when the dimension of the charged metal dot 120 is not adequately controlled. Therefore, some embodiments of the present disclosure further provides a method of twisting the chirality of the CNT 150 from metallic into semiconducting is provided as follows.

Figure 5A:
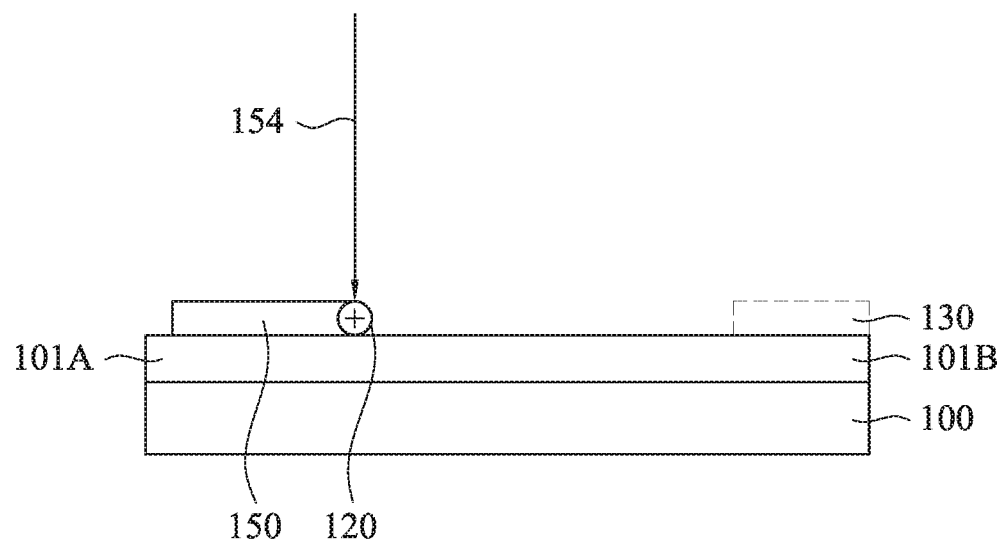
Figure 5B:
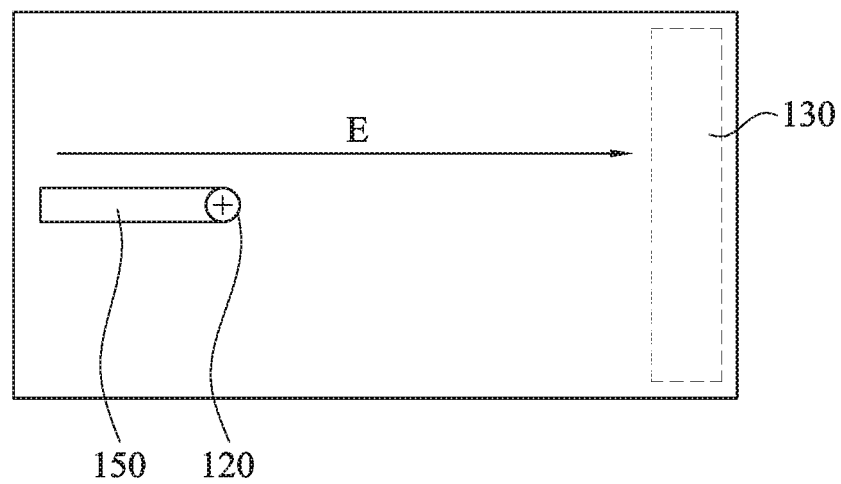

Reference is made to FIG. 1A, FIG. 5A and FIG. 5B. FIG. 5A is a schematic cross-sectional view and FIG. 5B is a schematic top view showing an intermediate stage of forming the semiconductor device. At operation S16, the flow of the precursor gas is stopped. In some embodiments of the operation S16, the flow of the precursor gas 140 and the flow of the hydrogen gas are stopped when the metallic CNT 150 may be formed. At operation S18, an electron beam is injected onto the charged metal dot to twist chirality of the CNT from metallic into semiconducting. In some embodiments of the operation S18, an electron beam 154 may be injected onto the charged metal dot 120 or the tip of the CNT 150 to promote negative charges (or electric charges) thereon. If the flow of the precursor gas 140 and the flow of the carrier gas are not stopped at the operation S16, the electron beam 154 may be interrupted by the flow of the precursor gas 140 and the flow of the carrier gas, causing failure in twisting the chirality of the CNT 150. Besides, if the flow of the precursor gas 140 and the flow of the carrier gas are not stopped at the operation S16, the CNT 150 will continually grow, and it would be difficult to align the electron beam 154 with the charged metal dot 120.

The electron beam 154 may be the electron beam 124 or 134 used for forming the charged metal dot 120 or the charged region 130 in FIG. 2A and FIG. 3A; however, the energy of the electron beam 154 may be same as or different from the energy of the electron beam 124 or 134. As a result, the charged metal dot 120 bears negative charges after the electron beam 154 is injected. In some embodiments, injecting the electron beam 154 onto the charged metal dot 120 further includes performing an alignment operation before the electron beam 154 is introduced onto the charged metal dot 120 so that the electron beam 154 can be precisely aligned with the charged metal dot 120. That is, the electron beam 154 is focused on a small area such as the charged metal dot 120 rather than the whole CNT 150, so that a net charge of the CNT 150 remains positive, and the electric field direction E remains the same. Alternatively, a wider e-beam may be used to change the charge on the CNT tip so that the alignment will not be so critical.

In some embodiments, an electron beam voltage of the electron beam 154 is greater than the electron beam voltage of the electron beam 124 or 134, for example, the electron beam voltage of the electron beam 154 may be about 20 kV to about 100 kV. In other embodiments, an electron beam current of the electron beam 154 is smaller than the electron beam current of the electron beam 124 or 134, for example, the electron beam current of the electron beam 154 may be about 1 pA to about 100 pA. A high voltage with a low current are used for a narrow electron beam to improve the alignment between the electron beam 154 and the charged metal dot 120.

Figure 6A:
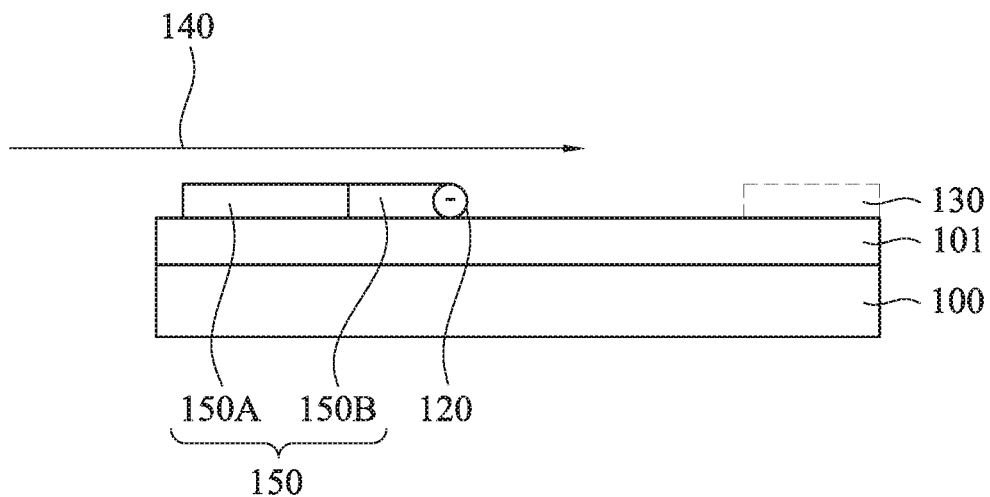
Figure 6B:
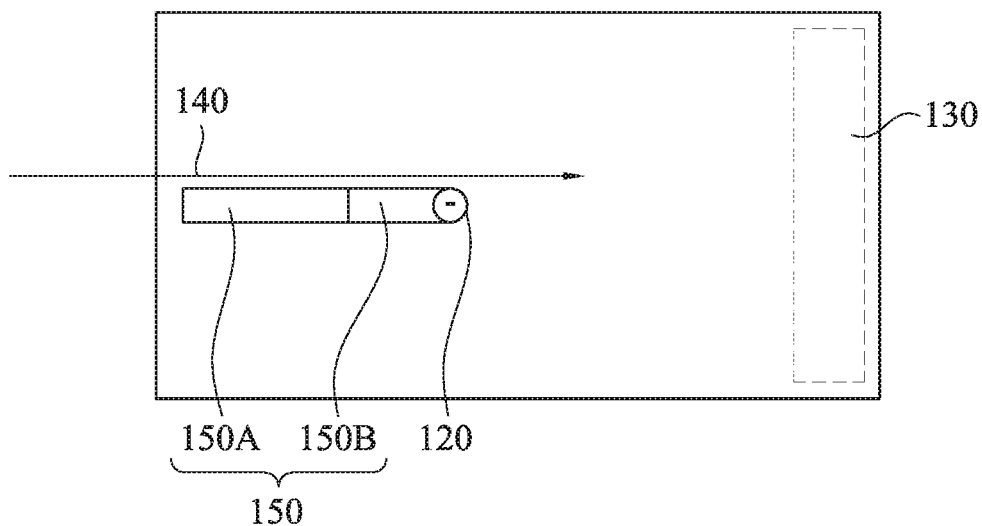

Reference is made to FIG. 1A, FIG. 6A and FIG. 6B. FIG. 6A is a schematic cross-sectional view and FIG. 6B is a schematic top view showing an intermediate stage of forming the semiconductor device. At operation S20, the precursor gas flows again to continue growth of the CNT. In some embodiments of the operation S20, the precursor gas 140 with the hydrogen carrier gas flows again to grow the CNT 150. The negatively charged metal dot 120 twists chirality of the CNT 150 from metallic (a portion 150A) into semiconducting (a portion 150B). Generally, negatively charging the charged metal dot 120 can significantly lower down a renucleation barrier of the metallic CNT to the semiconducting CNT (m→s), causing the twist of the chirality of metallic CNT. However, a renucleation barrier of the semiconducting CNT to the semiconducting CNT (s→s)) is much lower than the renucleation barrier (m→s), so that the semiconducting CNT remains semiconducting after the charged metal dot 120 is negatively charged. Furthermore, the net charge of the CNT 150 remains positive, and thus the direction of the growth of the CNT 150 remains same as the electric field direction E. The parameters of flowing the precursor gas 140 in the operations S20 may be same as the parameters disclosed in the operation S14, and may not be repeated herein.

Figure 7A:
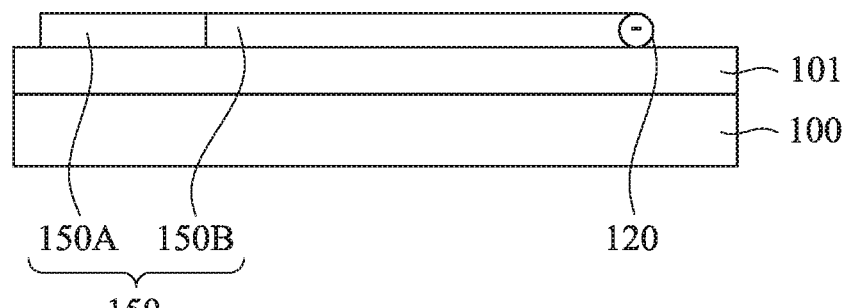
Figure 7B:
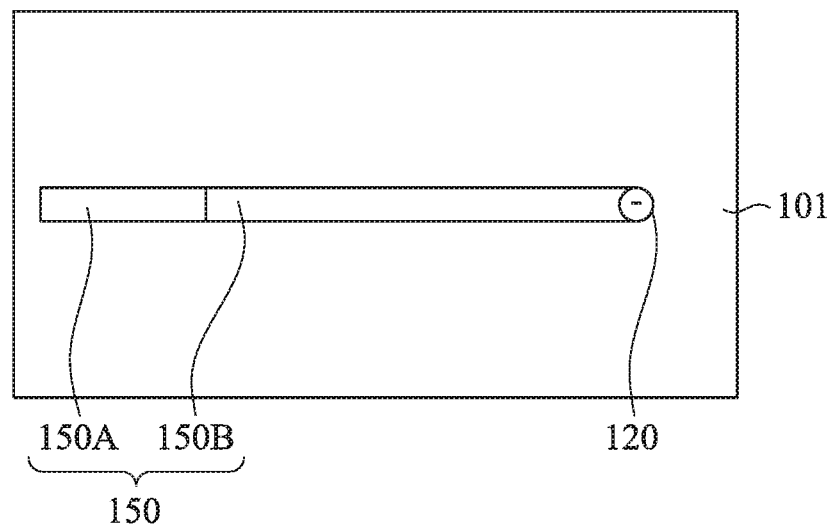
Figure 7C:
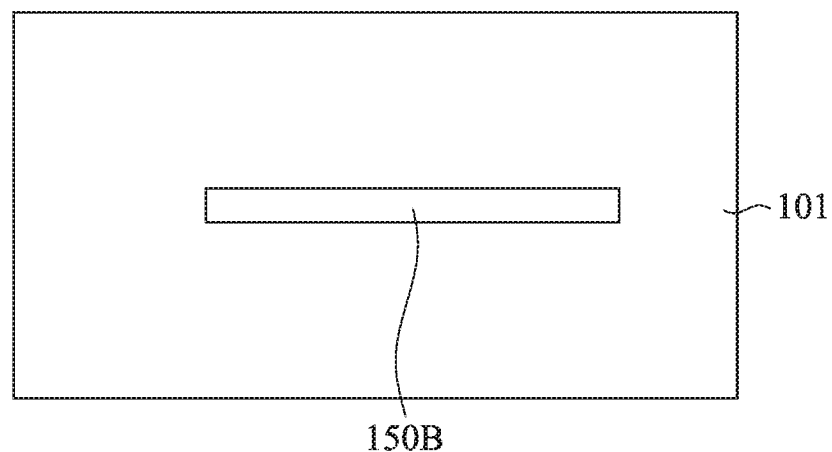

FIG. 7A is a schematic cross-sectional view and FIG. 7B is a schematic top view showing an intermediate stage of forming the semiconductor device. As shown in FIG. 7A and FIG. 7B, the CNT 150 having the metallic portion 150A and the semiconducting portion 150B is formed. The method allows the CNT growth on the semiconductor substrate 100, and thus transferring the CNT from other substrates (e.g., quartz or sapphire substrate) is not required. In some embodiments, the charged region 130 is not neutralized, and the charged region 130 may be used when an implanting operation is performed on the semiconductor substrate 100. In other embodiments, as shown in FIG. 7C, the metallic portion 150A and the tip portion including the charged metal dot 120 are removed by chemical mechanical planarization (CMP) or an etching operation such as wet etching, and the semiconducting portion 150B remains for subsequent semiconductor manufacturing processes. It is noted that the semiconducting portion 150B is referred to as the CNT 150 hereinafter for clear understanding.

Figure 8:
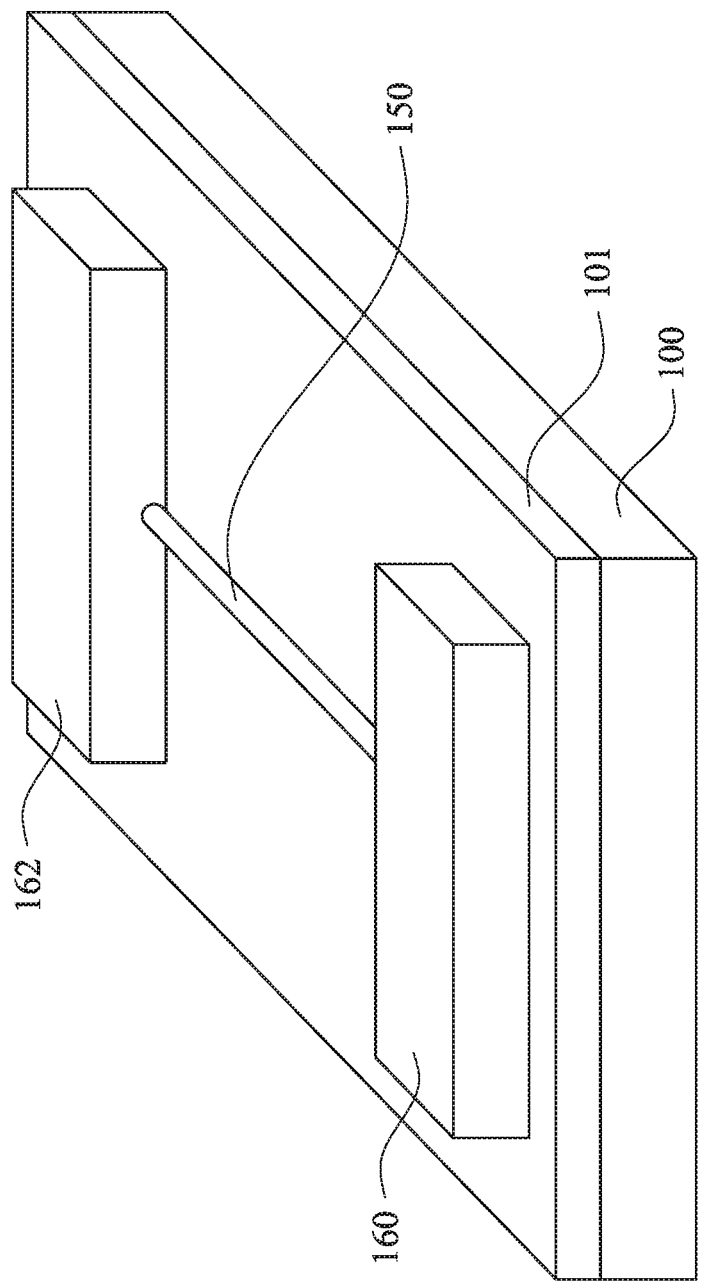

Reference is made to FIG. 1B and FIG. 8. FIG. 8 is a schematic 3-D view showing an intermediate stage of a method of forming a semiconductor device. At operation S22, a source electrode and a drain electrode are formed on two opposing end portions of the CNT. In some embodiments of the operation S22, a source electrode 160 and a drain electrode 162 are deposited on the insulating layer 101 over the semiconductor substrate 100 to cover two opposing end portions of the CNT 150. The source electrode 160 and the drain electrode 162 are separated by a selected distance or gap. However, the selected distance or gap can have any numerical values greater than 0 depending on a design or a requirement for forming the semiconductor device. Formation of the source electrode 160 and the drain electrode 162 may include blanket depositing a material of the source electrode 160 and the drain electrode 162 on the insulating layer 101, followed by selectively etching the material to form the source electrode 160 and the drain electrode 162. In alternative embodiments, a doping operation may be performed on the two end portions of the CNT 150, so as to introduce dopants into the end portions of the CNT 150.

Figure 9:
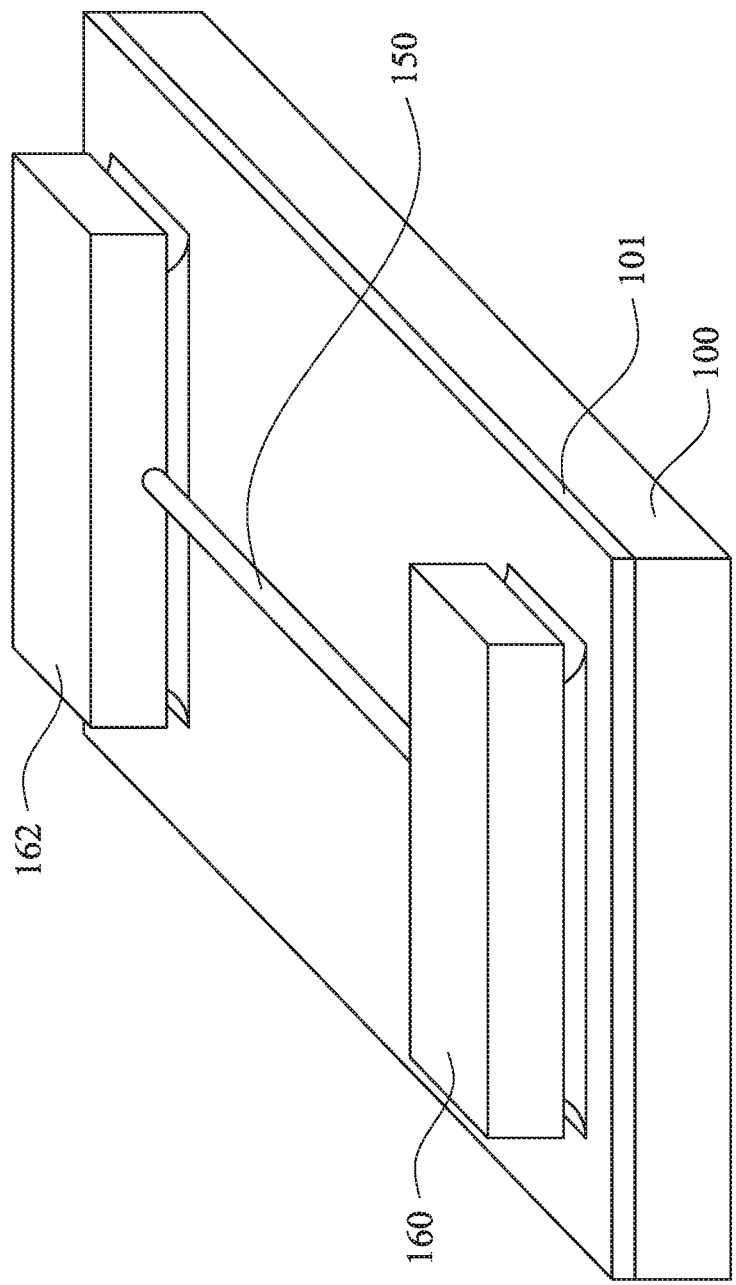

Reference is made to FIG. 1B and FIG. 9. FIG. 9 is a schematic 3-D view showing an intermediate stage of a method of forming a semiconductor device. At operation S24, a portion of the semiconductor substrate between the source electrode and the drain electrode is etched. In some embodiments of the operation S24, the insulating layer 101 may be etched to expose a bottom surface of the CNT 150, as shown in FIG. 9. In the embodiments where the insulating layer 101 is not formed on the semiconductor substrate 100, the semiconductor substrate 100 is etched to expose the bottom surface of the CNT 150. The CNT 150 is supported by the source electrode 160 and the drain electrode 162. In certain embodiments, the insulating layer 101 beneath the CNT 150 is etched away at least enough to allow a gate structure (shown later) to wrap around a portion 151 of the CNT 150 between the source electrode 160 and the drain electrode 162 for optimum gate control performance. The portion 151 of the CNT 150 wrapped by the gate structure is referred to as the channel region of the semiconductor device.

Figure 10A:
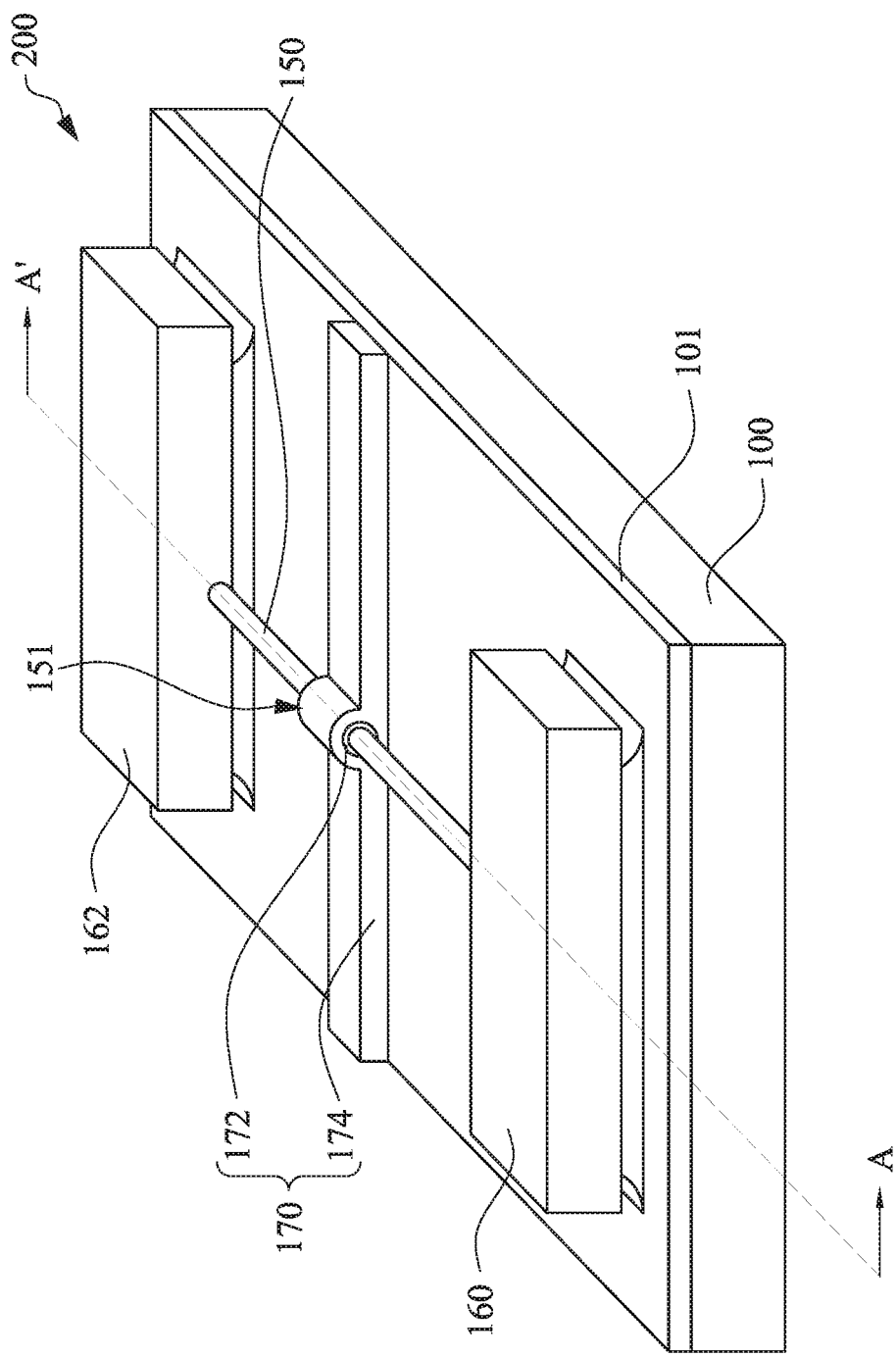
Figure 10B:
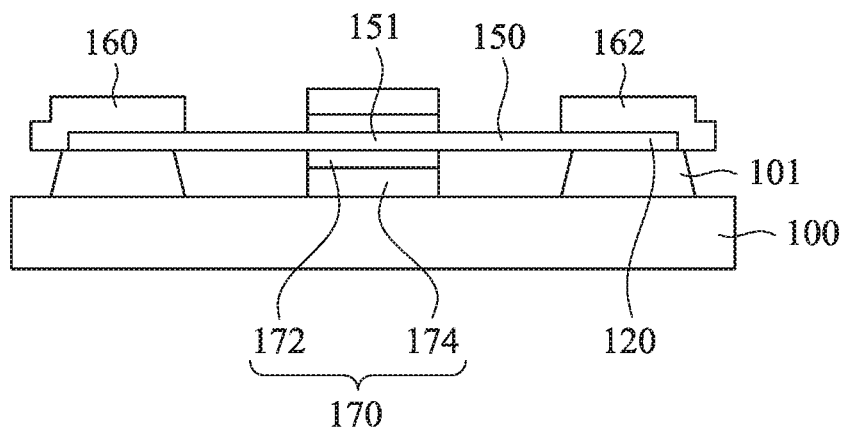

Reference is made to FIG. 1B, FIG. 10A and FIG. 10B. FIG. 10A is a schematic 3-D view showing a semiconductor device in accordance with some embodiments of the present disclosure, and FIG. 10B is a schematic cross sectional view viewed along a cut line A-A' of FIG. 10A. At operation S26, a gate structure is formed to wrap around a portion of the CNT between the source electrode and the drain electrode. In some embodiments of the operation S26, a gate structure 170 is formed to wrap around the portion 151 of the CNT 150, so-as to form a semiconductor device 200. Forming the gate structure 170 includes forming a gate dielectric layer 172 that warps around the portion 151 of the CNT 150, followed by forming a gate electrode layer 174 on the gate dielectric layer 172. In certain embodiments, the gate dielectric layer 172 is formed on a surface of the portion 151 of the CNT 150 (as well as on an exposed portion of the semiconductor substrate 100 and the source electrode 160 and the drain electrode 162). Because the CNT 150 is exposed after etching away part of the insulting layer 101, the gate dielectric layer 172 may be formed completely around the CNT surface. The gate dielectric layer 172 may be an oxide formed by thermal oxidation or atomic-layer CVD for uniform deposition, for example. Hence, the gate dielectric layer 172 will likely form on all exposed regions, including the source electrode 160 and the drain electrode 162. The gate dielectric layer 172 may take the form of a variety of compositions, including but not limited to silicon dioxide ($SiO_2$), silicon oxynitride ($SiO_xN_y$), $HfO_2$, $ZrO_2$, $Al_2O_3$, $La_2O_3$, or other high permittivity materials, in which x>0 and y>0.

A material of the gate electrode layer 174 is then deposited, masked, and etched to form the gate electrode layer 174, as shown in FIGS. 10A and 10B. The material of the gate electrode layer 174 may be selected from a variety of materials, including but not limited to a semiconductor material (e.g., poly-silicon, poly-silicon-germanium); a metal material (e.g., molybdenum, tungsten, titanium); a metallic nitride (e.g., tantalum nitride, titanium nitride); or any combination thereof, for example. As shown in FIG. 10A and FIG. 10B, because the CNT 150 is elevated above the insulating layer 101 (at least where the channel will be formed), the gate electrode layer 174 may be formed completely around the CNT 150, as preferred. During or after the etching of the material of the gate electrode layer 174 to form the patterned gate electrode layer 174, the gate dielectric layer 172 may be removed from the source and drain regions, as shown in FIG. 10A and FIG. 10B.

The gate dielectric layer 172 can be self-aligned with the gate electrode layer 174 by simply etching material of the gate electrode layer 174 with an etch chemistry that will also etch away the gate dielectric layer 172 while being selective against etching the semiconductor substrate 100 and the source electrode 160 and the drain electrode 162. Also, because the gate dielectric layer 172 at the gate channel is shielded by the gate electrode layer 174, the ion implantation processes for doping the semiconductor substrate 100 outside of the channel (i.e., to form source and drain of the semiconductor device 200) may be self-aligning as well.

Figure 11:
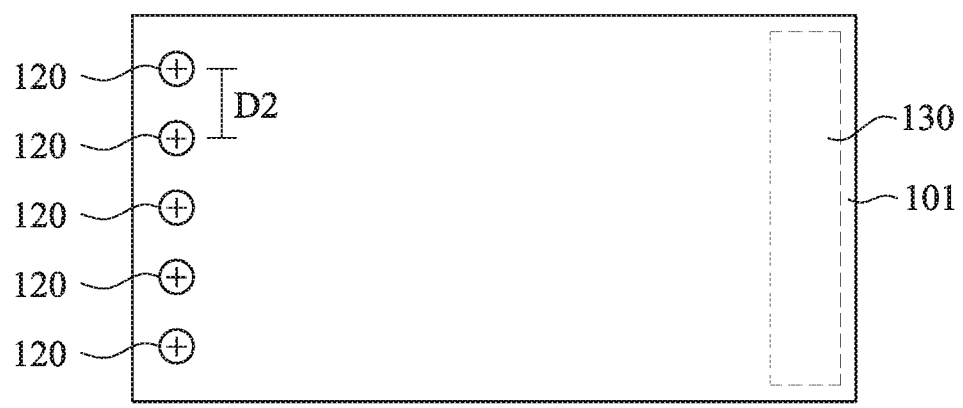
FIG. 11 and FIG. 12 are schematic top views showing intermediate stages of a method for forming a semiconductor device in accordance with other embodiments of the present disclosure.
Figure 12:
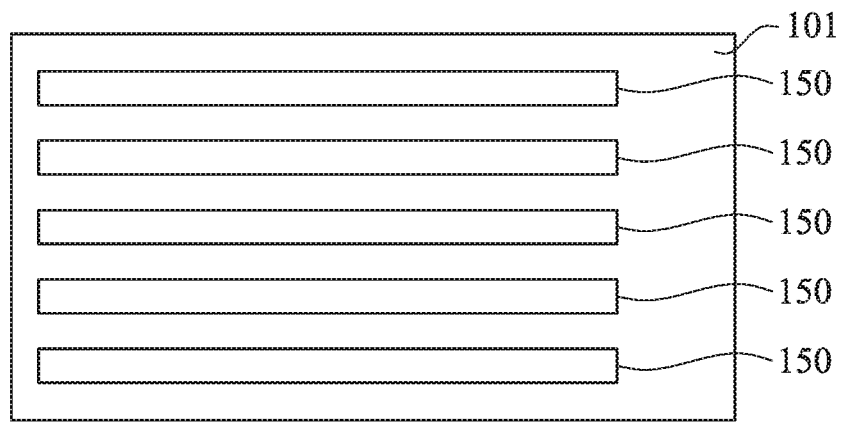
Figure 13:
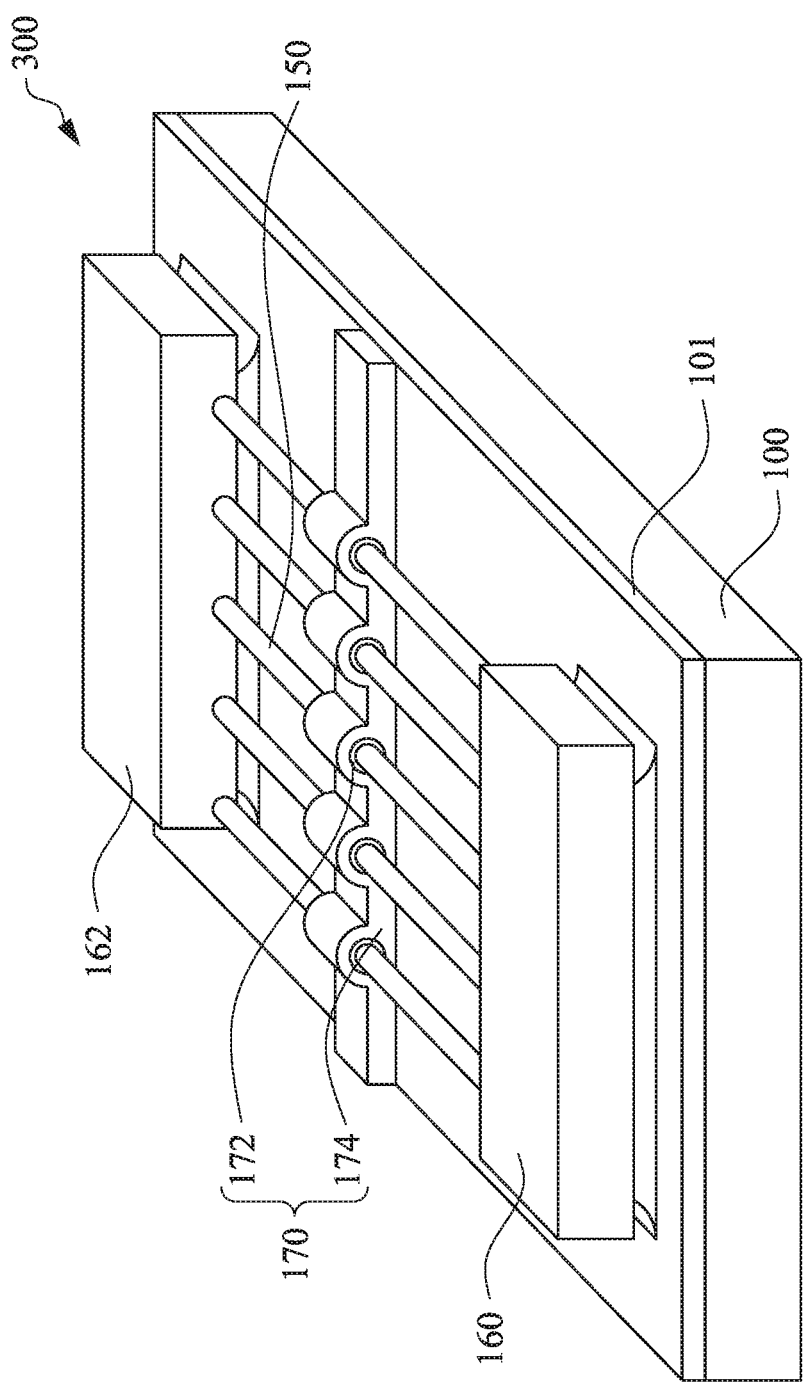
FIG. 13 is a schematic 3-D view of a semiconductor device in accordance with other embodiments of the present disclosure.

Reference is made to FIG. 11, FIG. 12 and FIG. 13. FIG. 11 and FIG. 12 are schematic top views showing intermediate stages of a method for forming a semiconductor device in accordance with other embodiments of the present disclosure. FIG. 13 is a schematic 3-D view of a semiconductor device in accordance with other embodiments of the present disclosure. In FIG. 11, plural charged metal dots 120 each of which bears positive charges are placed on the insulating layer 101 by the operations S10 and S12 described with reference to FIG. 2A through FIG. 3B. In some embodiments, a distance D2 between adjacent two charged metal dots 120 may be equal to or greater than about 5 nm. When the distance D2 is smaller than about 5 nm, the CNTs 150 formed by the charged metal dots 120 are likely to be interrupted by one another during the growth process due to the close distance. In certain embodiments, the distance D2 may be in a range from about 5 nm to about 100 nm because of the limitations of a device application. The distance between adjacent two charged metal dots 120 may be same as the distance between the other adjacent two charged metal dots 120. Alternatively, the distance between adjacent two charged metal dots 120 may be different from the distance between the other adjacent two charged metal dots 120.

With the charged metal dots 120, plural CNTs 150 can be formed by performing the operations S14 to S20 or merely the operation S14 of FIG. 1A with reference to FIG. 2A through FIG. 7B, as shown in FIG. 12. The operations S22 to S26 may subsequently performed on the structure of FIG. 12, thereby forming another semiconductor device 300 having multiple channel regions of FIG. 13. The multiple channel regions of the semiconductor device 300 are laterally arranged.

Figure 14:
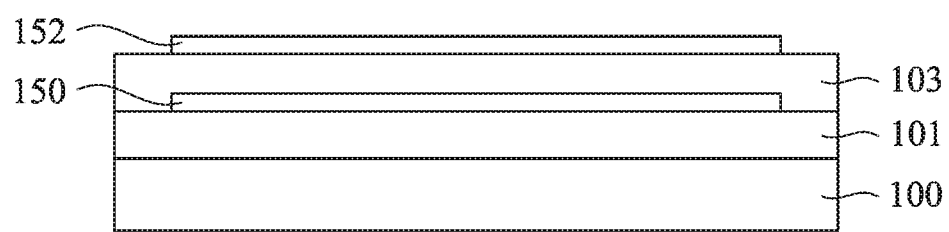
FIG. 14 is a schematic cross sectional view showing an intermediate stage of forming a semiconductor device in accordance with another embodiment of the present disclosure.
Figure 15:
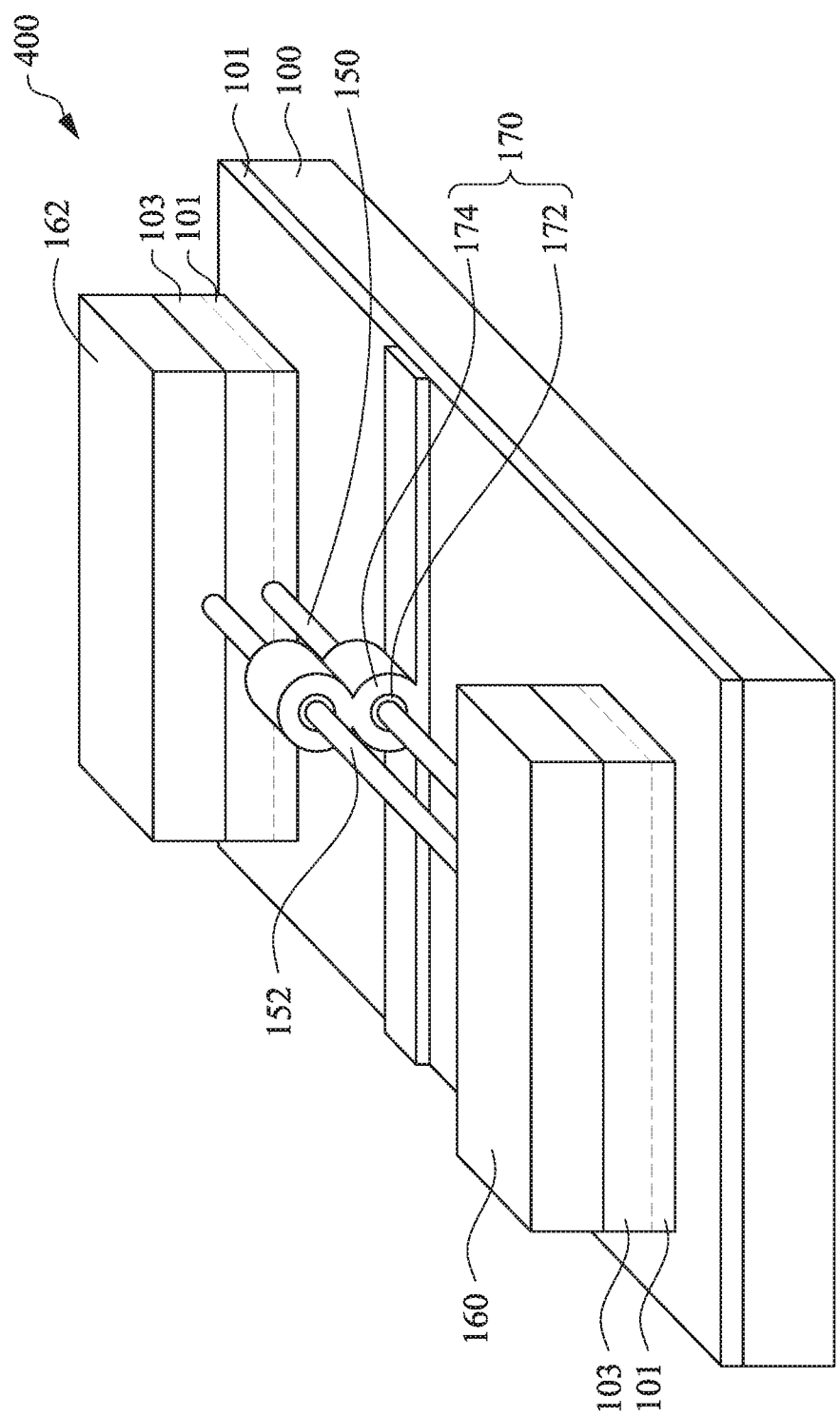
FIG. 15 is a schematic 3-D view of a semiconductor device in accordance with another embodiment of the present disclosure.

Reference is made to FIG. 14 and FIG. 15. FIG. 14 is a schematic cross sectional view showing an intermediate stage of forming a semiconductor device in accordance with another embodiment of the present disclosure. FIG. 15 is a schematic 3-D view of a semiconductor device in accordance with another embodiment of the present disclosure. The structure of FIG. 7C is provided first, and then a dielectric layer 103 is deposited on the CNT 150 and the insulating layer 101. In FIG. 15, an interface between the insulating layer 101 and the dielectric layer 103 are shown by a dotted line for clear understanding; however, the interface may not exist practically. In some embodiments, the dielectric layer 103 may be formed from the same material as the insulating layer 101. Next, the operations S10 to S14 or S10 to S20 may be performed on the dielectric layer 103, so as to form a second CNT 152 on the CNT 150. Therefore, the structure having the CNT 150 and the second CNT 152 that are vertically arranged is obtained. The operations S22 to S26 may subsequently performed on the structure of FIG. 14, thereby forming another semiconductor device 400 having multiple channel regions. The multiple channel regions of the semiconductor device 400 are vertically arranged.

Figure 16A:
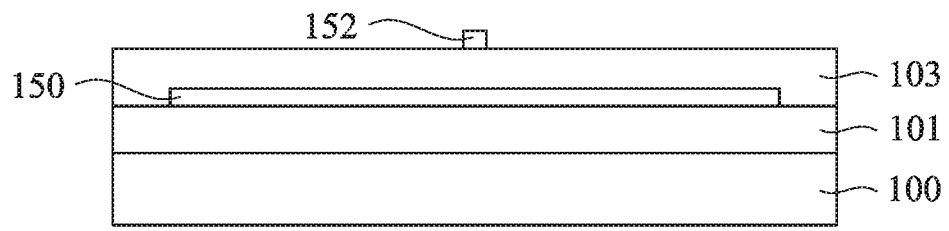
FIG. 16A is a schematic cross sectional view and FIG. 16B is a schematic top view showing an intermediate stage of forming a semiconductor device in accordance with another embodiment of the present disclosure.
Figure 16B:
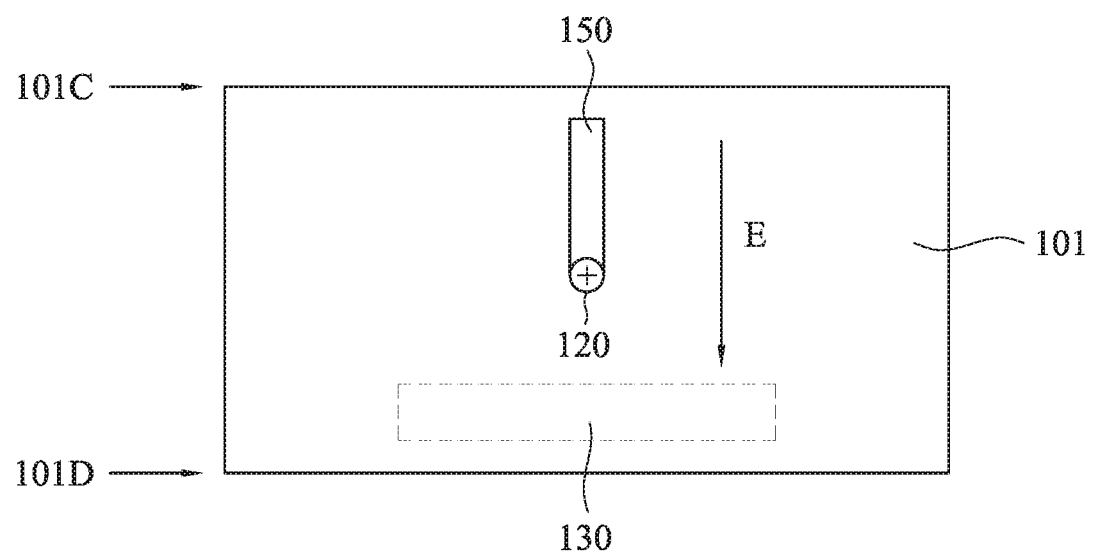

Reference is made to FIG. 16A and FIG. 16B. FIG. 16A is a schematic cross sectional view and FIG. 16B is a schematic top view showing an intermediate stage of forming a semiconductor device in accordance with another embodiment of the present disclosure. The method for forming the structure of FIG. 16A and FIG. 16B is similar to the method for forming the structure of FIG. 14. However, a growth direction of the second CNT 152 is changed by changing the electric field direction E to a direction not parallel to an extending direction of the CNT 150. For example, the growth direction of the second CNT 152 may be perpendicular to the extending direction of the CNT 150. As shown in FIG. 16B, the charged metal dot 120 and the charged region 130 are formed on two opposing end portions 101C and 101D that are different from the end portions 101A and 101B shown in FIG. 2A to FIG. 7B. In the embodiments of FIG. 16A and FIG. 16B, the direction that the precursor gas flows to form the second CNT 152 is also perpendicular to the extending direction of the CNT 150. In other words, the direction that the precursor gas flows changes along with the electric field direction. However, in other embodiments, the direction that the precursor gas flows may remain unchanged as shown in FIG. 4B because the growth direction of the CNT 150 is dominantly determined by the electrical field direction, and the direction along which the precursor gas flows is merely a minor factor.

Figure 17:
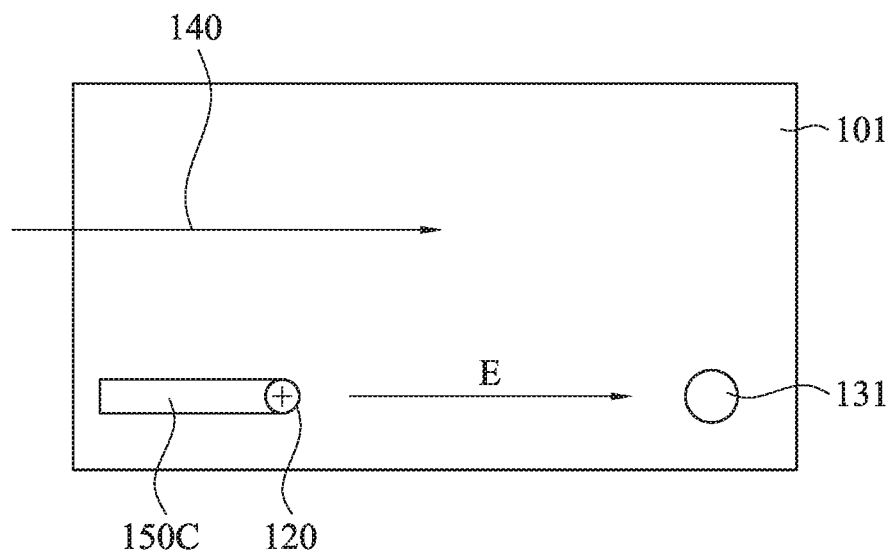
FIG. 17 and FIG. 18 are schematic top views showing intermediate stages of a method of forming a semiconductor device in accordance with another embodiment of the present disclosure.
Figure 18:
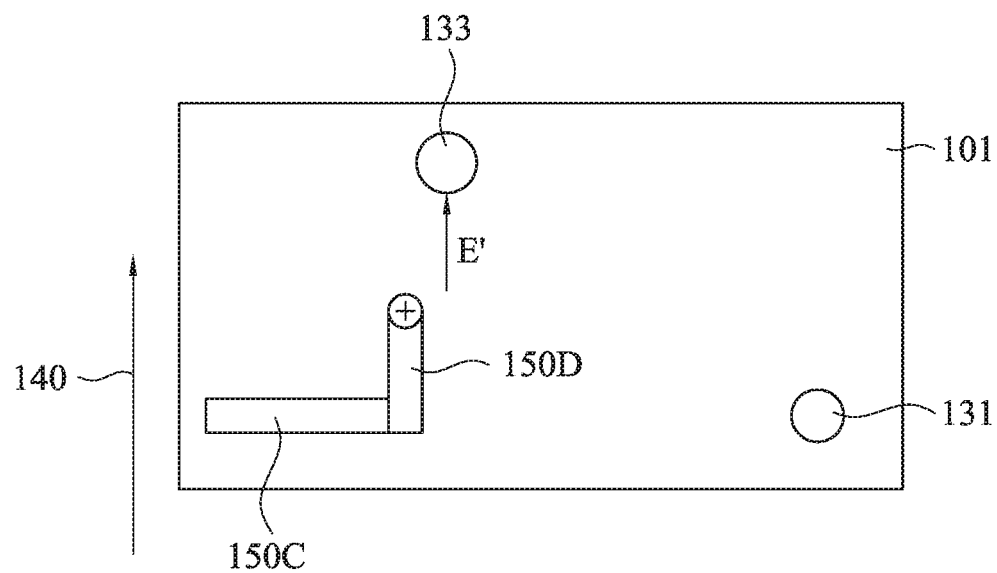

Reference is made to FIG. 17 and FIG. 18. FIG. 17 and FIG. 18 are schematic top views showing intermediate stages of a method of forming a semiconductor device in accordance with another embodiment of the present disclosure. In the embodiments of FIG. 17 and FIG. 18, the charged metal dot 120 is formed on the insulating layer 101 over the semiconductor substrate 100 as described in the operation S10 with reference to FIG. 2A and FIG. 2B. Then, a charged region 131 is formed as described in the operation S12 with reference to FIG. 3A and FIG. 3B. However, in the embodiments of FIG. 17 and FIG. 18, an area of the charged region 131 is controlled to be smaller than the charged region 130 of FIG. 3C for subsequent operations. Next, a lateral portion 150C of the CNT 150 grows as described in the operation S14 with reference to FIG. 4A and FIG. 4B, and the operations S16 to S20 may be alternatively performed depending on the chirality of the lateral portion 150C of the CNT 150. Then, as shown in FIG. 18, the operation S12 may be performed again to form another charged region 133 on the insulating layer 101. In some embodiments, the charged region 133 is formed, such that an electric field direction E' in FIG. 18 is different from the electric field direction E in FIG. 17. For example, the electric field direction E' is perpendicular to the extending direction of the lateral portion 150C of the CNT 150. To realize such electric field direction E', a net charge of the charged region 133 is greater than a net charge of the charged region 131, as shown in FIG. 18. Then, similar to the operation S14, the precursor gas 140 flows along the electric field direction E' to grow a vertical portion 150D of the CNT 150. In other words, the growth direction of the CNT 150 can be controlled using the charged regions that are formed on different locations on the semiconductor substrate 100, resulting in localized electric fields having different electric field directions on the semiconductor substrate 100.

One or more embodiments of the method of the present disclosure have several advantages over other methods applying the external electrodes. The ion beam adequately defines the dimension of the catalyst particle in a reproducible way giving the same diameter CNT in all locations. And, the ion beam technique is used such that the catalyst particle can be deposited easily in predetermined locations. Forming the localized electric field on the substrate allows a greater electric field compared to the external electric field, and the yield of the CNT is effectively improved. Furthermore, negatively charging the catalyst particle on the tip of the CNT can twist the chirality of the CNT from metallic to semiconducting, such that the purity of the semiconducting CNT may be properly controlled. In addition, the method also allows the aligned CNT growth on the semiconductor substrate, and transferring the CNT from other substrates such as quarts or sapphire is not required.

In some embodiments, a method is provided. In the method, a charged metal dot is placed on a first position of a surface of a semiconductor substrate. Then, a charged region is formed on a second position of the surface of the semiconductor substrate, thereby establishing of which an electric field direction from the first position toward the second position. The first position is spaced apart from the second position by a distance. Thereafter, a precursor gas flows along the electric field direction on the semiconductor substrate, thereby forming a carbon nanotube (CNT) on the semiconductor substrate.

In some embodiments, a method is provided. In the method, a charged metal dot is placed on a first position of a surface of a semiconductor substrate, in which the charged metal dot bears a positive charge. Then, a first charged region is formed on a second position of the surface of the semiconductor substrate, in which the first charged region has a first number of negative charges, and the first position is spaced apart from the first second position. Next, a first precursor gas flows along a first direction from the first position toward the second position on the semiconductor substrate, thereby forming a first portion of a carbon nanotube (CNT) on the semiconductor substrate. Then, a second charged region is formed on a third position of the surface of the semiconductor substrate. The third position is different from the first and second positions, and the second charged region has a second number of the negative charges that is greater than the first number of the negative charges. Thereafter, the first precursor gas flows along a second direction from the first position toward the third position on the semiconductor substrate, thereby forming a second portion of the CNT.

In some embodiments, a method is provided. In the method, a first charged metal dot is placed on a first position of a surface of a semiconductor substrate. Then, a first charged region is formed on a second position of the surface of the semiconductor substrate. The first position is space apart from the second position. Next, a precursor gas flows along a first direction from the first position toward the second position on the semiconductor substrate, thereby forming a first carbon nanotube (CNT) on the semiconductor substrate. Then, a dielectric layer is deposited to cover the first CNT and the semiconductor substrate. Next, a second charged metal dot is placed on a third position of a surface of the dielectric layer. Then, a second charged region is formed on a fourth position of the surface of the dielectric layer, in which the third position is space apart from the fourth position. Thereafter, the precursor gas flows along a second direction from the third position toward the fourth position on the semiconductor substrate, thereby forming a second CNT on the first CNT.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   placing a charged metal dot on a first position of a surface of a semiconductor substrate;
   forming a charged region on a second position of the surface of the semiconductor substrate, thereby establishing a localized electric field of which an electric field direction is from the first position toward the second position, wherein the first position is spaced apart from the second position by a distance;
   starting a flow of a precursor gas along the electric field direction on the semiconductor substrate, thereby forming a carbon nanotube (CNT) on the semiconductor substrate, wherein the charged region is formed prior to starting the flow of the precursor gas along the electric field direction on the semiconductor substrate;
   stopping the flow of the precursor gas, wherein after the flow of the precursor gas is stopped, the CNT has a first intermediate end and a second intermediate end opposite the first intermediate end, and wherein the charged metal dot is disposed at the second intermediate end;
   aligning a first electron beam with the charged metal dot on the second intermediate end of the CNT to focus the first electron beam on the charged metal dot; and
   injecting the first electron beam onto the charged metal dot to negatively charge the charged metal dot; and
   further comprising after placing the charged metal dot on the first position of the surface of the semiconductor substrate, reducing a dimension of the charged metal dot.

2. The method of claim 1, further comprising starting the flow of the precursor gas again on the semiconductor substrate to continue growth of the CNT, wherein the charged metal dot, which is negatively charged, twists chirality of the CNT from metallic into semiconducting to form the CNT having a metallic portion and a semiconducting portion.

3. The method of claim 2, further comprising removing the metallic portion and the charged metal dot of the CNT.

4. The method of claim 1, further comprising forming an oxide layer overlying the surface of the semiconductor substrate, wherein the charged metal dot is placed on the oxide layer.

5. The method of claim 1, further comprising:
   forming a source electrode and a drain electrode respectively on two opposing end portions of the CNT;
   removing a portion of the semiconductor substrate underlying the CNT, so as to expose a portion of the CNT; and
   forming a gate structure wrapping the portion of the CNT.

6. The method of claim 1, wherein the distance is in a range from about 5 nm to about 100 nm.

7. A method, comprising:
   placing a charged metal dot on a first position of a surface of a semiconductor substrate, wherein the charged metal dot bears a positive charge;
   forming a first charged region on a second position of the surface of the semiconductor substrate, wherein the first charged region has a first number of negative charges, and the first position is spaced apart from the second position;
   flowing a first precursor gas along a first direction from the first position toward the second position on the semiconductor substrate, such that a first portion of a carbon nanotube (CNT) is formed on the semiconductor substrate;
   forming a second charged region on a third position of the surface of the semiconductor substrate, wherein the third position is different from the first and second positions, and the second charged region has a second number of the negative charges that is greater than the first number of the negative charges; and
   flowing the first precursor gas along a second direction on the semiconductor substrate, such that a second portion of the CNT is formed on the semiconductor substrate and extends directly from an end of the first portion of the CNT, wherein the second direction is different from the first direction; and
   further comprising after placing the charged metal dot on the first position of the surface of the semiconductor substrate, reducing a dimension of the charged metal dot.

8. The method of claim 7, wherein placing the charged metal dot comprises flowing a second precursor gas and injecting an electron beam onto the semiconductor substrate.

9. The method of claim 7, wherein forming the first charged region and forming the second charged region respectively comprises injecting an electron beam onto the semiconductor substrate.

10. The method of claim 7, further comprising stopping flowing the first precursor gas before forming the second charged region.

11. The method of claim 7, wherein the first charged region is formed, such that a localized electric field is established between the first position and the second position of the surface of the semiconductor substrate, and the localized electric field guides the charged metal dot to move toward the first charged region.

12. The method of claim 7, further comprising negatively charging the charged metal dot after flowing the first precursor gas along the second direction.

13. A method, comprising:
   placing a metal dot that is positively charged over a first portion of a semiconductor substrate;
   forming a negatively charged region over a second portion of the semiconductor substrate by injecting a first electron beam onto the semiconductor substrate, wherein the metal dot is positively charged prior to forming the negatively charged region;
   growing a first portion of a carbon nanotube (CNT) towards the negatively charged region, wherein the first portion of the CNT has opposite first and second ends, the first end of the first portion of the CNT is closer to the negatively charged region than the second end of the first portion of the CNT is to the negatively charged region, and the metal dot is located adjacent to the first end of the first portion of the CNT after the first portion of the CNT is grown;
   negatively charging the metal dot by injecting a second electron beam onto the semiconductor substrate after growing the first portion of the CNT, wherein an electron beam current of the second electron beam is smaller than an electron beam current of the first electron beam; and
   growing a second portion of the CNT towards the negatively charged region after negatively charging the metal dot; and
   further comprising after placing the charged metal dot on the first position of the surface of the semiconductor substrate, reducing a dimension of the charged metal dot.

14. The method of claim 13, wherein growing the first portion of the CNT is performed such that the first portion of the CNT is metallic.

15. The method of claim 13, wherein growing the second portion of the CNT is performed such that the second portion of the CNT is semiconductive.

16. The method of claim 13, wherein growing the second portion of the CNT is performed such that the metal dot moves towards the negatively charged region when the second portion of the CNT is grown.

17. The method of claim 13, wherein the metal dot remains positively charged after the first portion of the CNT is grown and before the metal dot is negatively charged.

18. The method of claim 7, wherein the second direction is not parallel with the first direction.

19. The method of claim 13, wherein an electron beam voltage of the second electron beam is greater than an electron beam voltage of the first electron beam.

\* \* \* \* \*